United States Patent [19]

Moroi et al.

[11] Patent Number: 5,118,378
[45] Date of Patent: Jun. 2, 1992

[54] APPARATUS FOR DETECTING AN END POINT OF ETCHING

[75] Inventors: Tatsuo Moroi; Keiji Tada; Noriaki Yamamoto; Tetsunori Kaji; Gen Marumoto; Yuzou Ohhirabaru, all of Kudamatsu, Japan

[73] Assignee: Hitachi, Ltd., Tokyo, Japan

[21] Appl. No.: 751,677

[22] Filed: Aug. 23, 1991

Related U.S. Application Data

[63] Continuation of Ser. No. 419,312, Oct. 10, 1989, abandoned.

[51] Int. Cl.⁵ .............................................. C23F 1/02
[52] U.S. Cl. .................................... 156/345; 422/52; 422/98; 356/306; 356/316; 364/498
[58] Field of Search ............... 156/345, 626, 627, 643; 422/52, 83, 98; 356/72, 306, 316; 364/498

[56] References Cited

U.S. PATENT DOCUMENTS

| 4,457,820 | 7/1984 | Bergeron et al. | 156/626 |
| 4,493,745 | 1/1985 | Chen et al. | 156/626 |
| 4,615,761 | 10/1986 | Tada et al. | 156/626 |
| 4,846,928 | 7/1989 | Dolins et al. | 156/626 |
| 4,847,792 | 7/1989 | Barna et al. | 156/626 |
| 4,861,419 | 8/1989 | Flinchbaugh et al. | 156/626 |

FOREIGN PATENT DOCUMENTS

| 57-169241 | 10/1982 | Japan . |
| 59-113625 | 6/1984 | Japan . |
| 60-060712 | 4/1985 | Japan . |
| 62-65424 | 3/1987 | Japan . |
| 62-93940 | 4/1987 | Japan . |
| 62-93943 | 4/1987 | Japan . |
| 62-128124 | 6/1987 | Japan . |
| 62-165920 | 7/1987 | Japan . |
| 63-10523 | 1/1988 | Japan . |
| 63-107026 | 5/1988 | Japan . |
| 63-178527 | 7/1988 | Japan . |
| 63-254732 | 10/1988 | Japan . |
| 63-303086 | 12/1988 | Japan . |
| 1181424 | 7/1989 | Japan . |
| 1-226153 | 9/1989 | Japan . |
| 1235336 | 9/1989 | Japan . |

Primary Examiner—Michael G. Wityshyn
Assistant Examiner—John J. Bruckner
Attorney, Agent, or Firm—Antonelli, Terry, Stout & Kraus

[57] ABSTRACT

A method of detecting an end point of etching by emission spectroscopy. Using a constant ratio between emission intensities in the course of etching and after the termination thereof, a correction value is computed with data of a waveform already adjusted to be capable of detecting an end point of etching and the corresponding emission intensity in the course of etching treatment thereafter, and the waveform of corresponding emission intensity in the course of etching treatment is processed so that the detection can be conducted on the same level as in the end point detection already adjusted to be capable of detecting the end point of etching at the time of treatment. Thus, irrespective of the reduction of the quantity of emission for an emission detection at each time of treatment, a constant electric signal of the same detecting level can be obtained, making it possible to detect an end point of etching with the same accuracy as in the initial treatment.

4 Claims, 7 Drawing Sheets

APPARATUS FOR DETECTING AN END POINT OF ETCHING

This application is a continuation of Ser. No. 07/419,312, filed on Oct. 10, 1989, now abandoned.

BACKGROUND OF THE INVENTION

1. Field of the Invention

The present invention relates to a method of and an apparatus for detecting an end point of etching, and more particularly to a method of and an apparatus for detecting by emission spectroscopy an end point of etching of a specimen, such as the substrate of a semiconductor device, to be etched by plasma treatment.

2. Description of the Invention

As an apparatus for detecting by emission spectroscopy an end point of etching of a specimen such as the substrate of a semiconductor device to be etched by plasma treatment, there is known, for example, one which is disclosed in Japanese Patent Laid-Open No. 303086/1988. According to this conventional art, an electric output signal from a photoelectric converter is stored as a standard signal in a storage of normal emission in a storage when the cloudiness of a window member is within a permissible range. A member of monitoring the state of the cloudiness compares an actual signal from the photoelectric converter with the standard signal and generates an output corresponding to the result of such comparison. Based on this output signal, a signal for the required correction will be transmitted to the member of detecting an end point of etching. Thus, even when the level of the output signal from the photoelectric converter to the member of detecting an end point of etching is lowered because of the cloudiness of the window member, the end point of the etching treatment can be detected while correction is being made for the member to detect an end point of etching. Thus, the detection of an end point thereof is carried out accurately.

In this conventional art, however, nothing has been disclosed as to how the actual signal of the photoelectric converter can be compared with the standard signal to obtain a signal to instruct correction. How the signal to instruct correction is added to the member of detecting an end point of etching has not been disclosed, either. Also, this conventional art describes that even when the level of the signal output of the photoelectric converter to the member to detect an end point of etching is lowered because of the cloudiness of the window member, the end point of etching treatment can be detected while correction is being made for the member to detect an end point of etching. However, if the end point of etching treatment must be detected while correction is being made for the member to detect the end point thereof, there may be a fear that an accurate detection of the end point of etching becomes impossible depending on some case where a treatment time for etching is, for example, very short requiring the immediate detection of an end point of etching. In such case, the end point thereof has come while correction is still being made. In other words, the end point thereof may have been detected before a final correction was still to be made. Also, since the end point of etching is detected while correction is being made, there arises the problem of a delay in the treatment time.

In addition to this conventional art, there are known ones using emission spectroscopy for detecting an end point of etching which are disclosed in Japanese Patent Laid-Open No. 65424/1987 and Japanese Patent Laid-Open No. 165920/1987.

The conventional art disclosed in Japanese Patent Laid-Open No. 65424/1987 describes that while etching a specimen, the first waveform of emission intensity and a waveform n thereof are compared with each other without any correction at each time, and with the differential value thus obtained, those of $n+1$ are corrected, making it easier to carry out the detection of an end point of etching. However, according to this conventional art, there arises a problem of affecting accuracy adversely because the correction should be made in the next treatment in accordance with the previous data.

Another conventional art disclosed in Japanese Patent Laid-Open No. 165920/1987 describes that a signal at the time of previous treatment is compared with an input signal, and if there is any differential value between them, the value of the electric signal will be adjusted to be identical to the signal at the time of previous treatment, by changing a gain value of the photoelectric converter so that any detection of an end point of etching in the same process can be conducted by the same detecting value even when the quantity of emission collected by the photoelectric converter is changing because of the cloudiness of the observation window or the like. However, this conventional art will result in a delay in the time between the output signal transmitted by the comparing function and the response thereto by an adjustment function.

Furthermore, there are known ones concerning the apparatus of this kind, which are disclosed in Japanese Patent Laid-Open No. 60772/1985, Japanese Patent Laid-Open No. 93940/1987, Japanese Patent Laid-Open No. 128124/1987, U.S. Pat. No. 4,615,761, Ser. No. 07/000,368 and others.

SUMMARY OF THE INVENTION

The primary object of the present invention is to provide a method of and an apparatus for detecting an end point of etching in which an initial detection of the end thereof can be easily conducted even when the quantity of emission collected from an emission detector becomes smaller due to a repetitive etching treatment.

To attain the primary object of the present invention, there is provided an apparatus for detecting an end point of etching by emission spectroscopy in a repetitive etching treatment, which comprises a means of computing correction in accordance with the data obtainable in the course of the subsequent etching treatment by utilizing the constant ratio of the emission intensities in the course of etching and after the termination thereof in an etching treatment, and an apparatus having a means of adjusting a waveform of the corresponding emission intensity in said etching treatment so as to conduct the detection on the same detecting level as in the detection at the time of initial treatment, and a method of adjusting the waveform of the corresponding emission intensity in the course of said etching treatment so as to conduct a detection on the same detecting level at the time of initial treatment by computing correction in accordance with the data obtainable at the time of initial treatment and the corresponding emission intensity in the course of the subsequent etching treatment. Thus, irrespective of the quantity of emission of each detection which decreases at each time of the treatment, a constant electric signal is obtainable on the same detecting level, making it possible to conduct easily the detection of an end point of etching as accurately as the one at the time of initial treatment.

DETAILED DESCRIPTION OF THE PREFERRED EMBODIMENTS

Figure 2A:
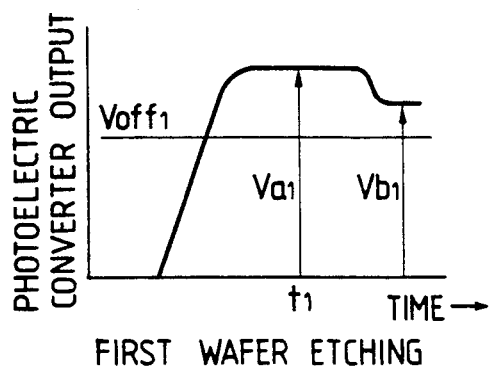
FIG. 2(a) is a diagram representing the waveform of an electric signal converted by a photoelectric converter at the time of first treatment.
Figure 2B:
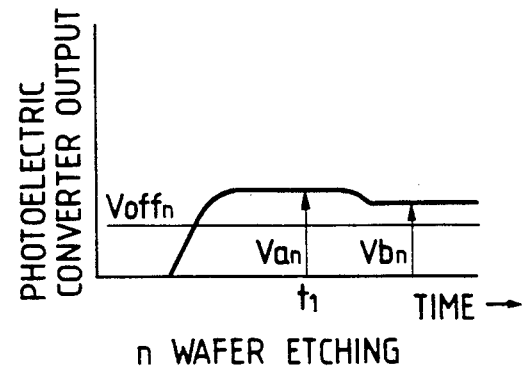
FIG. 2(b) is a diagram representing the waveform of an electric signal converted by the photoelectric converter at the time of n treatment.

Since the etching treatment of a specimen, which is a wafer in this case, is repeated in an etching treatment, the quantity of emission collected from an etching chamber, namely an output (an electric signal, in this case, being a voltage signal) of a photoelectric converter shown in FIG. 2(b) becomes smaller than the output obtainable at the time of initial treatment shown in FIG. 2(a). In other words, output Va1 in the course of etching and output Vb1 after the termination thereof both being after time t1 (in this case, a preset time after the etching began) in the treatment of the first wafer (the initial treatment) as shown in FIG. 2(a) are reduced to output Van in the course of etching and to output Vbn after the termination thereof both being after time t1 in the treatment of n wafer as shown in FIG. 2(b). Also, at the same time, the differential value between output Va1 and output Vb1 at the time of the first wafer treatment becomes smaller as in the case of the differential value between Van and Vbn at the time n wafer treatment. It is considered that this has been brought about by the worsening condition of the plasma spectrum penetration in the lighting section of the emission detector because of the repetitive etching treatment which has caused a reactive product to adhere to the surface of an inner wall of the treatment chamber. It has been proven by the experiments by the inventor of the present invention and some others that the following relationship can be established between the outputs of the photoelectric converter in these treatments of the first and n wafers:

$$\frac{Va_1}{Vb_1} \approx \frac{Va_n}{Vb_n} = \text{constant} \qquad (1)$$

The present invention utilizes this relationship for detecting an end point of etching accurately.

Now, the first embodiment of the present invention will be described with reference to FIGS. 1, 2(a)-2(b), and 3-6.

Figure 1:
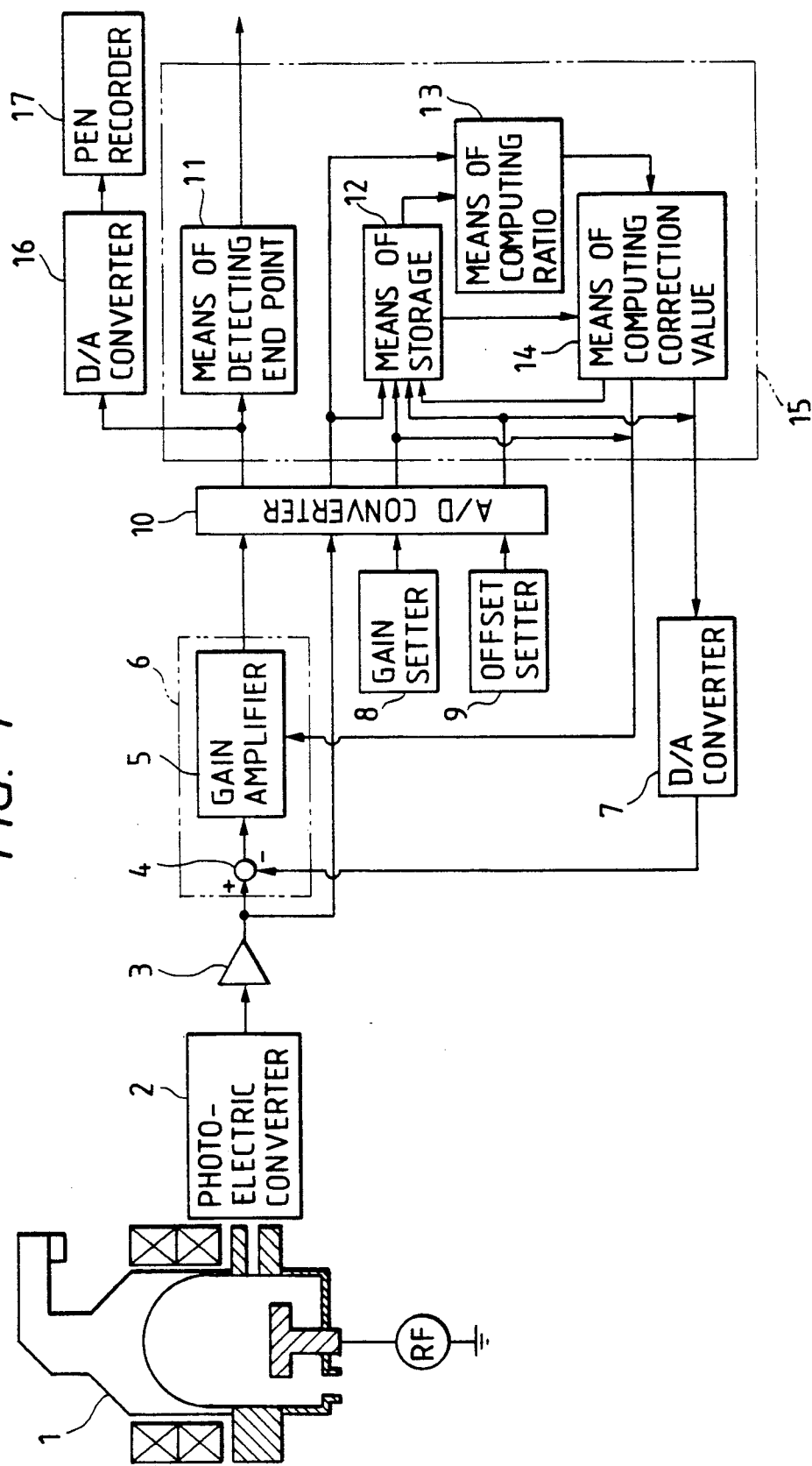
FIG. 1 is a block diagram illustrating an apparatus for detecting an end point of etching in the first embodiment of the present invention.

One example of a means of detecting an end point of etching is illustrated in FIG. 1. In an apparatus for etching treatment like, for example, microwave etching apparatus 1, photoelectric converter 2 is provided in the section thereof to collect emission of plasma spectrum. An output of photoelectric converter 2, which is a means of converting electric signal, is transmitted through buffer 3 to means of storage 12 and means of computing ratio 13 through A/D converter 10. Another output of photoelectric converter 2 is transmitted sequentially through subtracter 4 and gain amplifier 5 to means of detecting an end point of etching 11 and D/A converter 16 for an output signal of a corrected emission intensity, each through A/D converter 10 respectively. A signal from D/A converter 16 will be output to a means of representation, for example pen recorder 17.

Signals of gain setter 8 (for example, a variable resistor) and offset setter 9 (for example, a variable resistor) are output to means of storage 12 respectively through A/D converter 10. Another signal of the side of gain setter 8 is output to gain amplifier 5. Another signal of offset setter 9 is output to subtracter 4 through D/A converter 7 for use of adjustment.

Means of storage 12 stores as input a direct output signal from photoelectric converter 2, signals each from gain setter 8 and offset setter 9, and a signal from means of computing correction value 14 which will be explained later. Also, means of storage 12 outputs its stored contents to means of computing ratio 13 and means of computing correction value 14.

Means of computing ratio 13 compares the output value of, for example, the first specimen transmitted from photoelectric converter 2, which has been stored in means of storage 12, and the output value a subsequent specimen from photoelectric converter 2 and computes the ratio thereof. Also, means of computing ratio 13 will output the resulting ratio to means of computing correction value 14. The ratio in this case is arrived at by Va1/Van ... (2) based on the previous expression (1).

Figure 3:
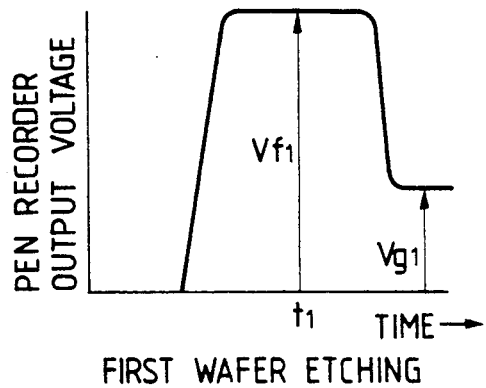
FIG. 3 is a diagram representing the waveform of an electric signal corrected at the time of first treatment.

Now, means of computing correction value 14 corrects offset and gain values stored in means of storage 12 with a ratio worked out by means of computing ratio 13, and computes new offset and gain values. Also, means of computing correction value 14 will transmit the new offset and gain values to D/A converter 7 and gain amplifier 5. At the same time, the newly computed offset and gain values will be transmitted to and stored in means 12. In this case, the required values to be worked out will be arrived at as follows:

Ordinarily, an output of photoelectric converter 2 as it is has too small a differential value between the intensity of a signal in the course of etching and that of a signal at the termination thereof. It, therefore, becomes difficult to detect an end point of etching. To counteract this, the output of photoelectric converter 2 (voltage signal) is offset and amplified in order to make greater the differential value between the intensities of signals each in the course of etching and at the termination thereof so that the output can be corrected to detect the end point of etching easily. In this respect, the offset and gain values to be amplified are set initially, and the output value thus corrected will become as represented in FIG. 3. FIG. 3 shows the change of an output voltage (waveform of emission intensity) to pen recorder 17 in the first wafer treatment.

Output voltage Vf1 shown in FIG. 3 is arrived at by offsetting the photoelectric converter output shown in FIG. 2(a) with offset value Voff1 (in the first wafer treatment) and amplifying, for example with amplifying ratio G1 the differential value between the output value thus offset and output Va1 in the course of etching after time t1 has elapsed since the discharging began. Also output voltage Vg1 shown in FIG. 3 is the value being arrived at by amplifying with amplifying ratio G1 the differential value between the offset value of the output and output Vb1 at the termination of etching as shown in FIG. 2(a). The relative expression in this respect is as follows:

$$Vf_1 = (Va_1 - Voff_1) \times G_1 \quad (3)$$

$$Vg_1 = (Vb_1 - Voff_1) \times G_1 \quad (4)$$

Figure 4:
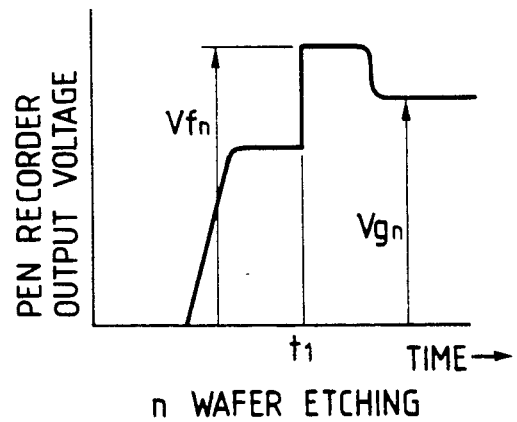
FIG. 4 is a diagram representing the waveform of an electric signal amplified from the electric signal previously corrected at the time of n treatment as it is.

Here, ordinarily, at the time of n wafer treatment the value thus amplified with amplifying ratio G1 after having been offset with offset value Voff1 becomes such an output voltage in time t1 as shown in FIG. 4 and is reduced as compared with the output voltage in the first wafer treatment as shown in FIG. 3. Therefore, as shown in FIG. 4, the amplifying ratio will be modified after time t1 so that output voltage Vfn can be amplified close to output voltage Vf1 shown in FIG. 3. However, as shown in FIG. 2(b), the differential value between outputs Van and Vbn of photoelectric converter in n wafer treatment becomes smaller so that the differential value between output voltage Vfn in the course of etching and output voltage Vgn after etching will be smaller as shown in FIG. 4 than that between Vf1 and Vg1 in the first wafer treatment shown in FIG. 3 with the result that it becomes difficult to detect the end point of etching.

To counteract this, according to the present invention, an amplifying ratio (gain value) Gn in n wafer treatment is determined by the following expression in accordance with a ratio obtainable by the above-mentioned expression (2) at the time when n wafer is treated.

$$Gn = \frac{Va_1}{Van} \times G_1 \quad (5)$$

Then, offset value Voffn of n treatment is set so that output voltage Vfn in n wafer treatment can be $$Vfn = Vf_1 \quad (6)$$

The relative expression in this respect is as $$(Van - Voffn) \times Gn = Vf_1 \quad (7)$$

$$\therefore Voffn = Van - \frac{Vf_1}{Gn}$$

In this way, offset value Voffn and gain value Gn in n wafer treatment can be computed by means of computing correction value 14, and both of them are established. As a result, output voltages Vfn and Vgn to pen recorder 17 will be as follows:

$$\begin{aligned} Vfn &= (Van - Voffn) \times Gn \\ &= (Van - Voffn) \times \frac{Va_1}{Van} \times G_1 \\ &= \left(Va_1 - Voffn \cdot \frac{Va_1}{Van}\right) \times G_1 \end{aligned} \quad (8)$$

$$\begin{aligned} Vgn &= (Vbn - Voffn) \times Gn \\ &= (Vbn - Voffn) \times \frac{Va_1}{Van} \times G_1 \\ &= \left(Vbn \cdot \frac{Va_1}{Van} - Voffn \cdot \frac{Va_1}{Van}\right) \times G_1 \end{aligned} \quad (9)$$

Now, the relationship among expression (3), (6), (8) can be represented as follows:

$$\left(Va_1 - Voffn \cdot \frac{Va_1}{Van}\right) \times G_1 = (Va_1 - Voff_1) \times G_1 \quad (10)$$

$$\therefore Voffn \cdot \frac{Va_1}{Van} = Voff_1$$

Expression (8) can be:

$$Vfn = (Va_1 - Voff_1) \times G_1 \quad (11)$$

Also, expression (10) can be reformulated:

$$Voffn = Voff_1 \cdot \frac{Van}{Va_1} \quad (12)$$

Furthermore, expression (1) can be reformulated:

$$Vbn = \frac{Vb_1}{Va_1} \cdot Van \quad (13)$$

From expressions (12), (13), expression (9) can be reformulated as follows:

$$\begin{aligned} Vgn &= \left(\frac{Vb_1}{Va_1} \cdot Van \cdot \frac{Va_1}{Van} - Voff_1 \cdot \frac{Van}{Va_1} \cdot \frac{Va_1}{Van}\right) \times G_1 \\ &= (Vb_1 - Voff_1) \times G_1 \end{aligned} \quad (14)$$

Figure 5:
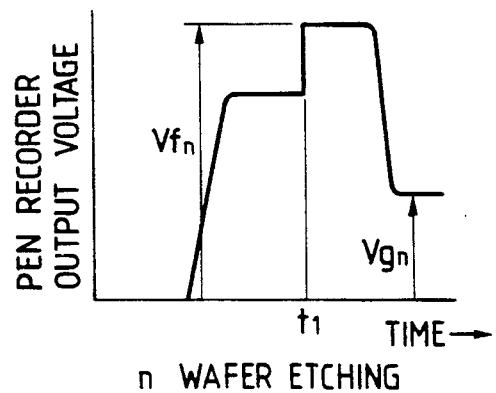
FIG. 5 is a diagram representing the waveform corrected by the present invention at the time of n treatment.

Consequently, expressions (3), (11) and expression (4), (14) can be:
Vf1 = Vfn
Vg1 = Vgn
Thus, the output voltage after time t1 on pen recorder 17 in n wafer treatment will be equal to the output voltage in the first wafer treatment as shown in FIG. 5.

An offset value computed by means of computing correction value 14 is converted to the analog value by D/A converter 7 and transmitted to subtracter 4. Thus, the offset value will reduce the output value of photoelectric converter 2. Also, a gain value computed by means of computing correction value 14 is transmitted to gain amplifier 5. Thus, the output value from subtracter 4 is multiplied by the gain value so that the output value of photoelectric converter 2 can be corrected.

In this respect, means of correcting input value 6 comprises subtracter 4 and gain amplifier 5. Also, means of detecting an end point 11, means of storage 12, means of computing ratio 13, and means of computing correction value 14 are defined as arithmetic and memory circuits in microcomputer 15.

Figure 6:
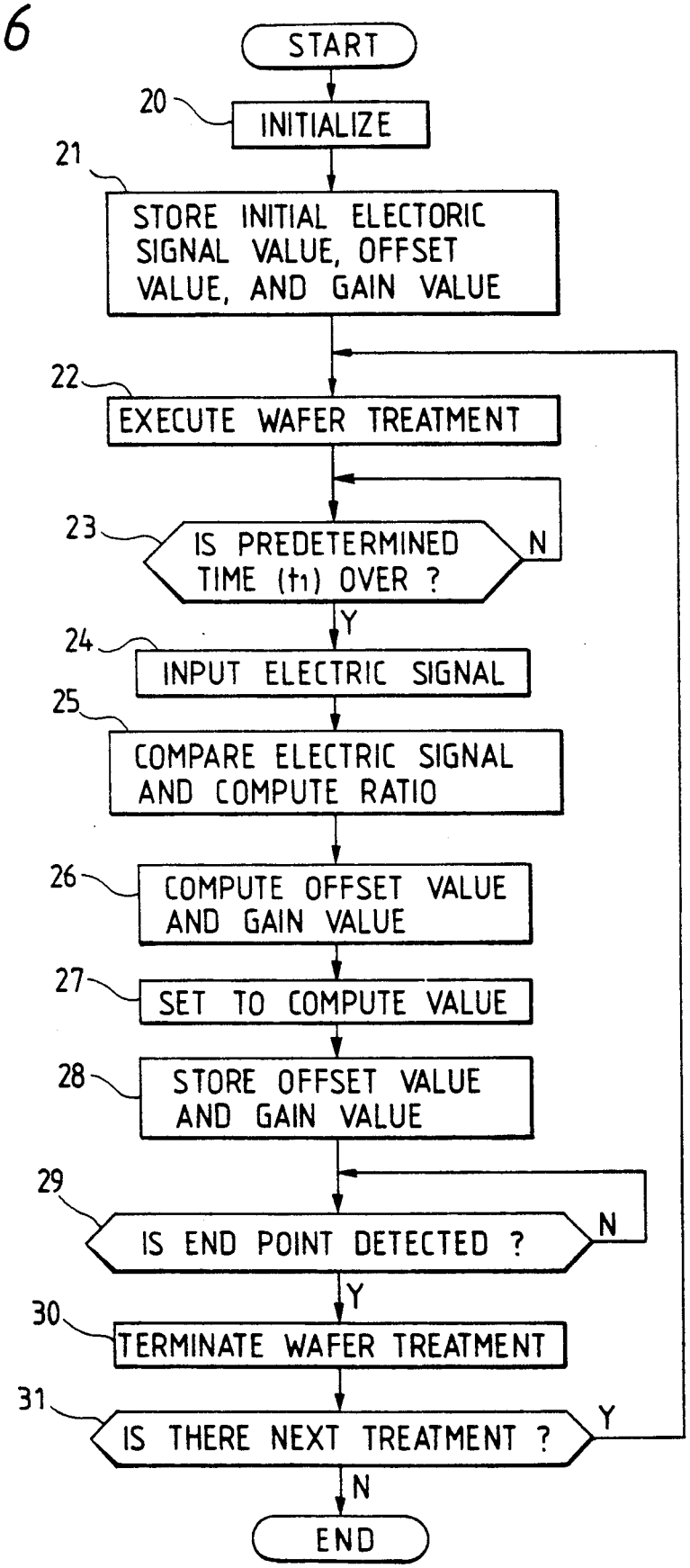
FIG. 6 is a flow chart representing the function of the apparatus shown in FIG. 1.

With an apparatus comprising as above, the detection of an end point of etching will be conducted according to steps shown in FIG. 6.

First, prior to carrying on etching treatment continuously on a wafer as a final product, an etching treatment will be conducted on a sample wafer. Then, emission is collected and inputted after being converted to an electric signal by photoelectric converter 2. Simultaneously, offset setter 9 and gain setter 8 are adjusted according to the waveform of an output voltage being shown on pen recorder 17 in order to set the offset and gain values to generate a waveform suitable for the detection of an end point of etching. Thus, the setting is initialized (step 20 represents this).

Next, the actual output value from photoelectric converter 2 to which the input was thus executed at the initialization will be stored in means of storage 12, and at the same time, the offset and gain values set at the initialization will be stored in means of storage 12 (step 21 represents this). In this respect, it will suffice for storage if the actual output value from photoelectric converter 2 should be at least an output value to be stored at time t1.

Next, the etching treatment of a wafer, which will be a final product, is started (step 22 represents this). An emission in the course of treatment is converted to an electric signal by photoelectric converter 2, and transmitted to means of correcting input 6. At this juncture, subtracter 4 and gain amplifier 5 will be set to the offset and gain values stored in means of storage 12 at the time of initialization. The output of photoelectric converter 2 is corrected by these correction values and then transmitted to pen recorder 17 representing a waveform.

When a preset time t1 has elapsed after a wafer treatment began, the other output of photoelectric converter 2 is inputted as it is to means of computing ratio 13 (steps 23 and 24 represent this). Ratio Va1/Van will be worked out through means of computing ratio 13 by comparison with the output value of photoelectric converter 2 at the time of initialization (step 25 represents this). Based on this ratio, new offset value Voffn and gain value Gn are worked out by means of computing correction value 14 (step 26 represents this). With these new correction values, subtracter 4 and gain amplifier 5 will be reset (step 27 represents this). Thus, the value transmitted to means of detecting an end point 11 will become the same as the value at the time of initialization.

At this juncture, the offset and gain values set at the time of initialization are replaced by the new offset and gain values used for resetting, and the new ones will be stored in means of storage 12 (step 28 represents this). In the next treatment, the electric signal transmitted for a period up to time t1 will be corrected by the new corrected value which has been reset.

In this way, with the electric signal which has been corrected to be identical to the waveform at the time of initialization, an end point of etching is detected by means of detecting an end point with a known method thereof, for example, the one disclosed in U.S. Pat. No. 4,615,761, using the secondary differentiation therein (step 29 represents this).

When an end point has been detected, a signal to terminate the etching is issued from means of detecting an end point 11 to stop each power supply (microwave, magnetic coil, high-frequency power source and others) of a microwave etching device 1 and supply of treatment gas. Thus, a wafer treatment is terminated, and the wafer thus treated will be transferred from the wafer treatment chamber (step 30 represents this). If there is any new treatment of wafer, the procedure will return to step 22, and if not, it terminates there (step 31 represents this).

Now, according to the first embodiment of the present invention, a correction value is computed by an output value of photoelectric converter 2 which has been inputted thereto after a preset time t1 in the course of etching, and the output value of photoelectric converter 2 can immediately be set to be equal to the emission intensity at the time of initialization so as to obtain a waveform of emission intensity on the same level of detection. There is, thus, an effect of conducting the detection of an end point of etching easily.

Also, the same waveform of an electric signal as the one corrected at the time of initialization can be obtained at the time of each treatment. Consequently, it becomes easy to detect an end point of etching irrespective of the numbers of treatment and at the same time, it is possible to detect an end point of etching accurately. Thus, the detection of an end point of etching becomes constant with the result that the quality of wafers in the same process can be unified.

Also, even when the etching treatment is repeatedly carried out, the detection of the end point thereof can be conducted without fail. It, therefore, becomes unnecessary to do cleaning often so that the lowering of throughput will be prevented.

According to the first embodiment of the present invention, the initial values of offset and gain are set at the time of initialization using a specimen as a sample. In this respect, any specimen which will be a finished product can also be used.

Next, the second embodiment of the present invention will be described with reference to FIGS. 2(a)-2(b) and 3-8, which uses a different method of correcting offset and gain values from the method previously described as an embodiment.

Figure 7:
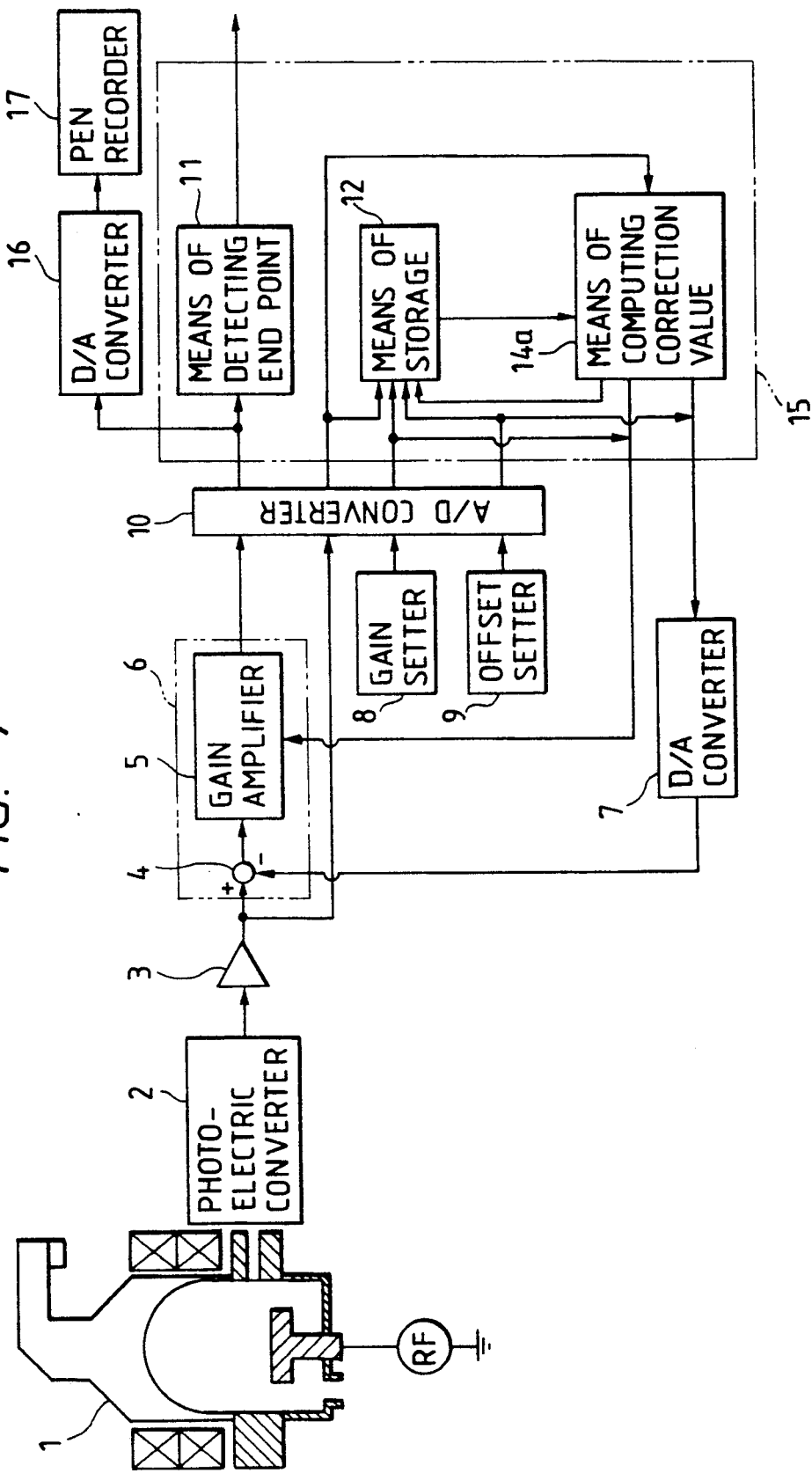
FIG. 7 is a block diagram illustrating the apparatus for detecting an end point of etching in the second embodiment of the present invention.

In FIG. 7, these members having the same reference numbers as in FIG. 1 represent the same members and explanations will be omitted. In FIG. 7, an output signal of photoelectric converter 2 is transmitted to means of storage 12 and means of computing correction value 14a through A/D converter 10 in order to obtain a ratio between output signals in the course of etching and at the termination thereof. Thus, this ratio is stored. This aspect is the only point which differs from those described in FIG. 1. Means of computing correction value 14a computes the ratio between outputs Va1 and Vb1 of photoelectric converter 2 shown in FIG. 2(a). Said ratio should be almost the same if the conditions of an etching process and the specification of a specimen are constant. For example, in case where an n wafer etching begins and time t1 has elapsed (for example, a preset time after the etching began), means of computing correction value 14a will work out corrected values of gain and offset in accordance with said ratio and output Van shown in FIG. 2(b), and output the corrected values to subtracter 4 and gain amplifier 5 respectively. In this case, the treatment will be as follows:

Gain value G is arrived at as follows:

$$G = \frac{Vf_1 - Vg_1}{Va_1(1 - K)} \quad (15)$$

Here,

Vf1: The value of output voltage at time t1 in the course of the first etching as shown in FIG. 3.

Vg1: The value of output voltage at the termination of the first etching as shown in FIG. 3.

K: Ratio Vb1/Va1 of the photoelectric converter output as shown in FIG. 2(a) (being fixed in accordance with the specification of a specimen and the conditions of etching process.)

Offset value Voff is arrived at as follows:

$$Voff_1 = Va_1 - \frac{Vf_1}{G} \quad (16)$$

Thus, the output to pen recorder 17 at the point of preset time t1 after etching began becomes Vf1, and also Vg1 after an end point of etching has been detected.

Furthermore, even when the photoelectric converter output in the course of n wafer treatment changes to be Van, Vbn as shown in FIG. 2(b), expression Vbn/Van = K is still obtainable if only the conditions of an etching process and the specification of a specimen are the same. Therefore, if gain value Gn and offset value Voffn in the course of n wafer are:

$$Gn = \frac{Vf_1 - Vg_1}{Van(1 - K)} \quad (17)$$

$$Voffn = Van - \frac{Vf_1}{Gn} \quad (18)$$

Output Vfn of pen recorder 17 at the point of time t1 shown in FIG. 5 will be the same as output voltage Vf1 shown in FIG. 3. Also, output Vgn after an end point of etching has been detected as shown in FIG. 5 will be the same as output voltage Vg1 shown in FIG. 3 so that the same waveform of emission intensity as the one in the course of the first wafer treatment can be obtained.

Figure 8:
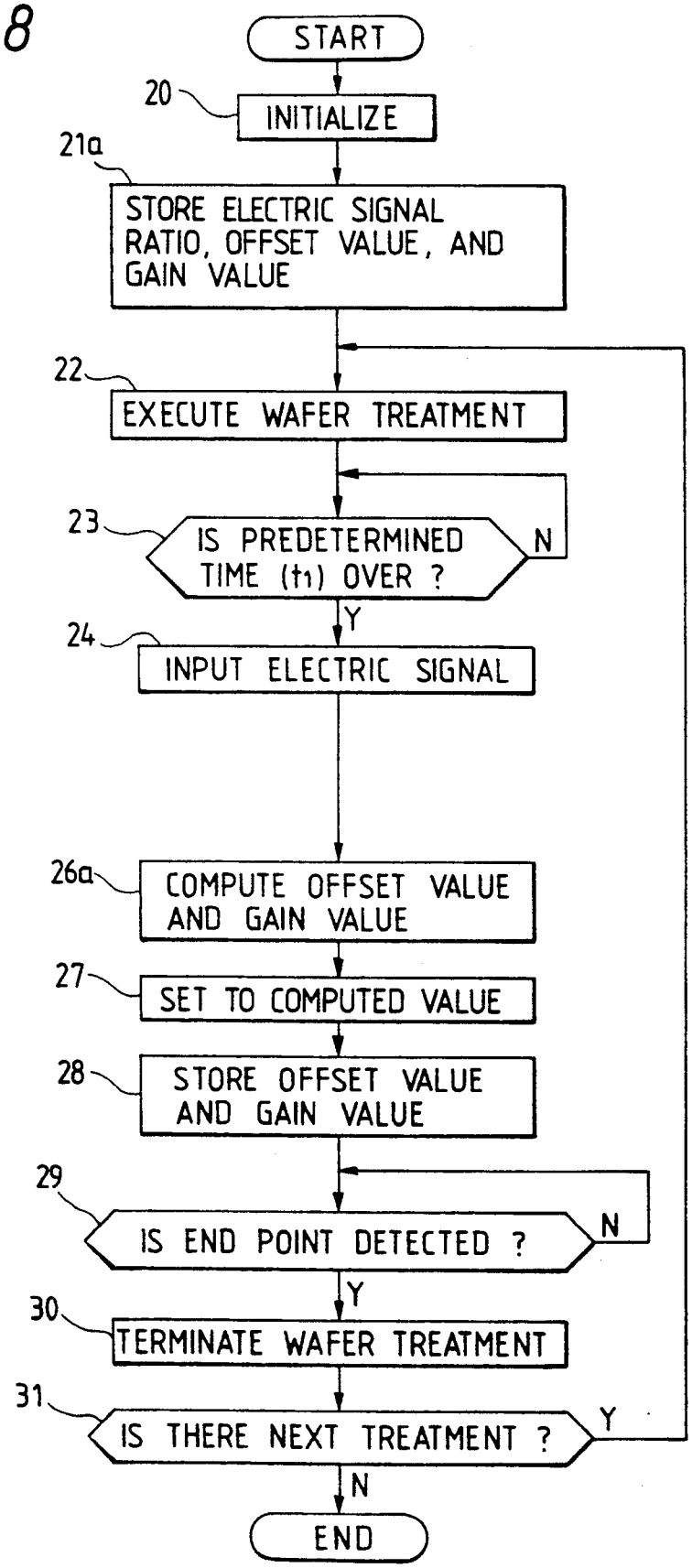
FIG. 8 is a flow chart representing the function of the apparatus shown in FIG. 7.

With an apparatus comprising as above and steps shown in FIG. 8, an end point of etching will be conducted. In FIG. 8, these having the same reference numbers as in FIG. 6 represent the same steps, and explanations are omitted. In FIG. 8, the ratio between output values in the course of etching and at the termination thereof are obtained by the output value of photoelectric converter 2 at the time of initialization, and said ratio and the offset and gain values will be stored in means of storage 12 (step 21a represents this). This is a point which differs from those steps shown in FIG. 6. Also, in case where a wafer is treated as a final product, the new values of gain and offset will be worked out by the ratio between the output values of photoelectric converter 2 inputted at the point of preset time (t1) and at the time of initialization (step 26a represents this). This is another point which differs from those steps shown in FIG. 6.

According to the second embodiment of the present invention, the same effect as referred to in an embodiment described as the first embodiment thereof is attainable.

Now, these first and second embodiments describe the case where the quantity of an emission increases in the course of etching (namely the waveform of emission intensity represent ⌒ shape upwardly), but they may satisfactorily be to the case where the quantity of an emission decreases in the course of etching (namely, the waveform of emission intensity representing ⌣ shape.)

Also, these first and second embodiment the case where a plurality of wafers are treated under the same process, but they may satisfactorily be applicable to the cases of a multiple etching treatment in which the process changes in the course of treating the same wafer or a wafer treatment in which the specification of a specimen and the conditions of an etching process change in the same device of treatment if only a plurality of wafers are treated under the same conditions.

Figure 9:
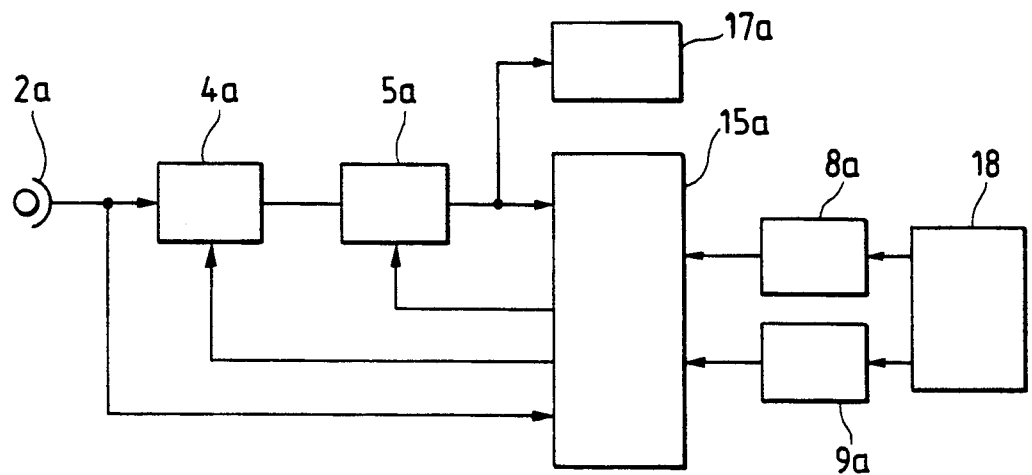
FIG. 9 is a schematic representation illustrating the structure of the apparatus for detecting an end point of etching in the third embodiment of the present invention.
Figure 10:
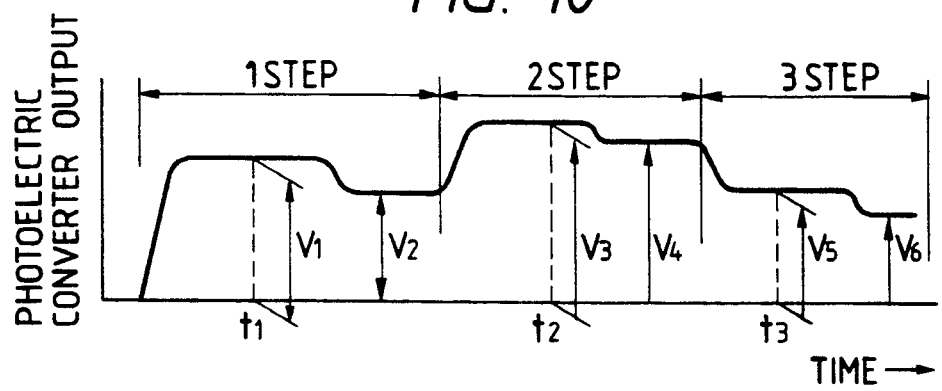
FIG. 10 is a diagram representing output voltages of the photoelectric converter at the time of multiple etching in the apparatus shown in FIG. 9.
Figure 11:
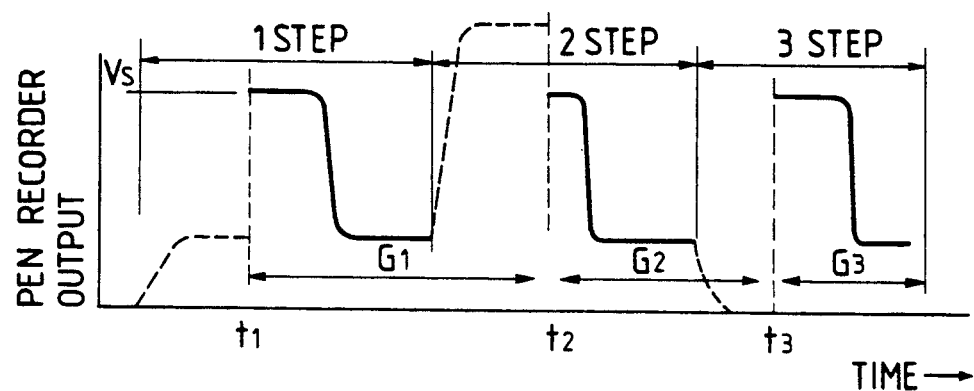
FIG. 11 is a diagram representing output waveforms of the pen recorder at the time of multiple etching in the apparatus shown in FIG. 9.

Now, a multiple etching treatment in which the process changes in the course of the same wafer treatment will be exemplified and explained as the third embodiment of the present invention with reference to FIGS. 9 to 11.

FIG. 9 is a schematic representation of the construction of an apparatus for detecting an end point of etching shown in FIG. 1. The apparatus for detecting an end point of etching comprises photoelectric converter 2a, offset adjuster 4a, gain adjuster 5a, arithmetic and memory circuit 15a, pen recorder 17a, gain setter 8a, and offset setter 9a. In this case, an offset value and again value in each step of multiple etching are set by offset setter 9a and gain setter 8a. Said offset and gain values thus set in each step are inputted and stored in arithmetic and memory circuit 15a. Also, an actual output (a voltage signal) of photoelectric converter 2a and a voltage signal sequentially output through offset adjuster 4a and gain adjuster 5a are inputted in arithmetic and memory circuit 15a. Arithmetic and memory circuit 15a outputs to offset adjuster 4a an offset value set by offset setter 9a or an offset value worked out in such a manner as has been explained in the first and second embodiments. Also, simultaneously, arithmetic and memory circuit 15a outputs to gain adjuster 5a a gain value set by gain setter 8a or a gain value worked out in such a manner as has been explained in the first and second embodiments. Furthermore, arithmetic and memory circuit 15a detects an end point of etching by an electric signal being sequentially output through offset adjuster 4a and gain adjuster 5a. Offset adjuster 4a subtracts an actual electric signal output from photoelectric converter 2a by an offset value being output from arithmetic and memory circuit 15a. Gain adjuster 5a multiplies said electric signal thus subtracted by a gain value being output from arithmetic and memory circuit 15a. Also, in the third embodiment of the present invention, the setting means 18, which will replace and reset the setting values of gain setter 8a and offset setter 9a, is provided in addition to an apparatus for detecting an end point of etching comprising the same as in FIG. 1.

In FIG. 10, an actual waveform of emission intensity is shown for a multiple etching, for example, the one with a three-step etching in an apparatus being constructed as above. Output voltages prior to the termination of etching (dead time t1) and after the termination thereof in step 1 will be V1 and V2. In step 2, output voltages prior to the termination of etching (dead time t2) and after the termination thereof will be V3 and V4. In step 3, output voltages prior to the termination of etching (dead time t3) and after the termination thereof will be V5 and V6. In this way, actual waveforms of emission intensity of the multiple etching vary in each step respectively.

Therefore, as shown in FIG. 11, each waveform of output to pen recorder 17a in each step is made to be identical in order to facilitate detecting an end point of etching therein. First, in step 1, values of offset and gain are adjusted and set so that an output waveform at the point of time t1 in step 1 will be made to detect an end point of etching easily. Next, in step 2, the values of gain and offset are adjusted and set so as to make the output waveform at the point of time t2 identical to the waveform set in step 1. Also, in step 3, the adjustment and setting are carried out as in step 2. The gain and offset values thus set in each step are replaced and reset by setting means 18 and are replaced by setting means 18 with a setting value in next step by, for example, time t1, t2, t3 or a present time after an end point of previous etching has been detected.

As has been described, according to the third embodiment of the present invention, the waveform whereby to detect an end point of etching in each step can be made to have a value of the same level. Thus, the detection of an end point of etching is facilitated.

Also, in the treatment of the second wafer and on, the offset and gain settings are conducted in each step while they are being corrected in the same manner as in the first and second embodiments, making it possible to detect an end point of etching efficiently irrespective of numbers of wafers to be treated.

Now, the replacement and resetting of gain and offset values may be conducted by the replacement and reading out by, for example, setting time (t1, t2, t3) and others after respective values having been stored in arithmetic and memory circuit 15a.

Also, the third embodiment of the present invention describes the case of multiple etching treatment in which process changes in the same wafer treatment but even in case of the wafer etching treatment where the specification of a wafer and the conditions of etching process change in the same treatment apparatus, it is possible to detect an end point of etching the same as in the first and second embodiments. In other words, instead of the aforementioned steps, the setting of offset and gain values are conducted by gain setter 8a and offset setter 9a according to each specification of a wafer or conditions of etching process. Said setting values are changed by setting means 18 in accordance with changes in the specification of a wafer and the conditions of etching process. Thus inputting the specification of a wafer and the conditions of etching process enables the functions of automatic gain and offset to work as in the first and second embodiments, making it easy to detect an end point of etching of the specimen, although the specification and conditions of process thereof change.

In these first, second, and third embodiments, the correction of emission intensity is made by offset and gain values in order to detect an end point of etching, but the correction of an amplifying ratio of the photoelectric converter may also be applicable. The construction of an apparatus in this case will be described with reference to FIG. 12 as the fourth embodiment of the present invention.

Figure 12:
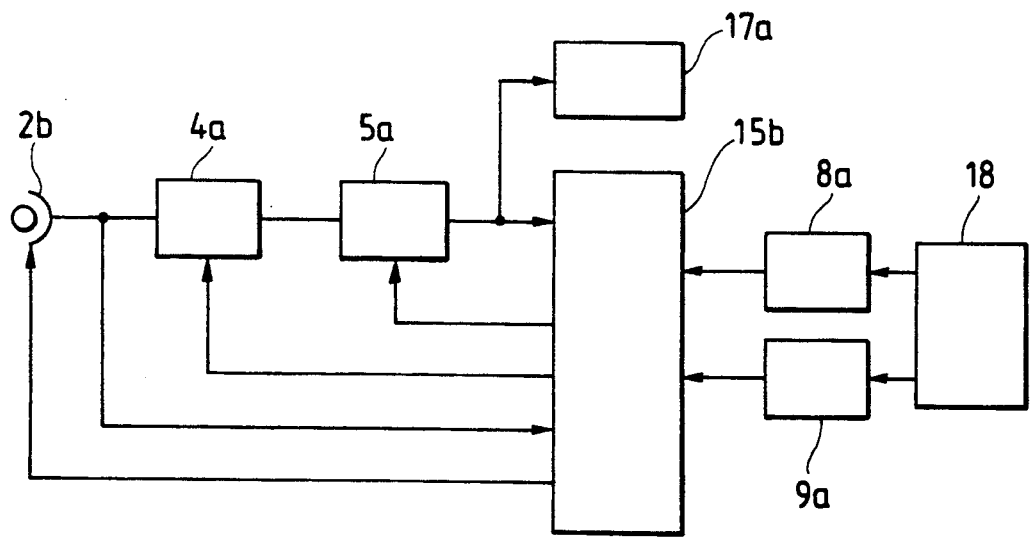
FIG. 12 is a schematic representation illustrating the structure of the apparatus for detecting an end point of etching in the fourth embodiment of the present invention.

In FIG. 12, these members having the same reference numbers as in FIG. 9 represent the same members, and explanations are omitted. In FIG. 12, the first point which differs from FIG. 9 is that the amplifying ratio of photoelectric converter 2b becomes obtainable. Also, the second point of difference is that arithmetic and memory circuit 15b compares as in the first embodiment a corresponding emission intensity in the course of etching treatment (an actual output of photoelectric converter 2b in the course of etching) with the emission intensity stored at the time of initialization (an actual output of photoelectric converter 2b at the time of initialization), and works out a new amplifying ratio of photoelectric converter 2b to correct the amplifying ratio of photoelectric converter 2b.

In an apparatus thus constructed, while an offset value and a gain value at the time of initialization remain as they are, the amplifying ratio of photoelectric converter 2b can be corrected. Thus, the waveform of emission intensity can be obtained as in the first embodiment to detect an end point of etching, making it possible to carry out the detection on the same level.

Therefore, according to the fourth embodiment of the present invention, the same effect as in the first embodiment is attainable.

As has been explained, according to the present invention, it is possible to detect an end point of etching as easy as to do the same at the time of initialization, even when an etching treatment is repeatedly carried out, resulting in the reduction of quantity of emission obtainable from the member of emission detecting.

Also, in each step of a multiple etching, the functions of automatic gain and offset can be utilized so as to facilitate detecting an end point of etching easily.

Furthermore, as inputting the specification of a specimen and the conditions of etching process enables the functions of automatic gain and offset to work, it is possible to detect easily an end point of etching of the specimen, although the specification and conditions of process thereof change.

What is claimed is:

1. An etching end point detecting apparatus detecting an end point of etching in an etching apparatus performing an initial etching treatment and a subsequent etching treatment, the etching end point detecting apparatus comprising:

a photoelectric converter detecting an optical emission from the etching apparatus during the first etching treatment and the subsequent etching treatment and converting the detected optical emission to an emission intensity signal;

a subtracter receiving the emission intensity signal from the photoelectric converter and subtracting an adjustable offset value from the received emission intensity signal, thereby producing an offset emission intensity signal;

an amplifier receiving the offset emission intensity signal from the subtracter and amplifying the received offset emission intensity signal by an adjustable gain value, thereby producing a correct emission intensity signal;

etching end point detecting means receiving the corrected emission intensity signal from the amplifier and detecting an end point of etching of the initial etching treatment and an end point of etching of the subsequent etching treatment from the received corrected emission intensity signal;

an initial offset value setter setting an initial offset value Voff1, outputting the set initial offset value Voff1, and setting the offset value of the subtracter to the outputted initial offset value Voff1 in the initial etching treatment;

an initial gain value setter setting an initial gain value G1, outputting the set initial gain value G1, and setting the gain value of the amplifier to the outputted initial gain value G1 in the initial etching treatment;

storage means receiving the emission intensity signal from the photoelectric converter, the initial offset value Voff1 from the initial offset value setter, and the initial gain value G1 from the initial gain value setter; storing an emission intensity value Va1 of the received emission intensity signal at a predetermined time t1 in the initial etching treatment; storing the received initial offset value Voff1 and the received initial gain value G1; and outputting the stored emission intensity value Va1, the stored initial offset value Voff1, and the stored initial gain value G1;

ration computing means receiving the emission intensity value Va1 from the storage means and the emission intensity signal from the photoelectric converter, computing an emission intensity value ratio Va1/Van from the received emission intensity value Va1 and an emission intensity value Van of the received emission intensity signal at a predetermined time t1 in the subsequent etching treatment, and outputting the computed emission intensity value ratio Va1/Van;

corrected value computing means receiving the emission intensity value ratio Va1/Van from the ratio computing means and the initial gain value G1 from the storage means; computing a corrected gain value Gn from the received emission intensity ratio Va1/Van and the received initial gain value G1 in accordance with the expression $Gn = (Va1/Van) \times G1$; computing a corrected offset value Voffn from the computed corrected gain value Gn, the emission intensity value Van, and an emission intensity value Vf1 of the corrected emission intensity signal at the predetermined time t1 in the initial etching treatment in accordance with the expression $Voffn = Van - (Vf1/Gn)$; outputting the computed corrected offset value Voffn and the computed corrected gain value Gn; and setting the offset value of the subtracter to the outputted corrected offset value Voffn and the gain value of the amplifier to the outputted corrected gain value Gn during the subsequent etching treatment.

2. An etching end point apparatus according to claim 1, wherein the etching apparatus is an etching apparatus performing the initial etching treatment and the subsequent etching treatment such that the initial etching treatment and the subsequent etching treatment are one type of etching treatment.

3. An etching end point apparatus according to claim 1, wherein the etching apparatus is an etching apparatus performing a multi-step etching treatment including a plurality of different types of etching treatments and performing the initial etching treatment and the subsequent etching treatment such that the initial etching treatment and the subsequent etching treatment are different types of etching treatments.

4. An etching end point apparatus according to claim 1, wherein the etching apparatus is an etching apparatus performing a plurality of different types of etching treatments and performing the initial etching treatment and the subsequent etching treatment such that the initial etching treatment and the subsequent etching treatment are one type of etching treatment.

* * * * *